United States Patent
Viswanathan et al.

(10) Patent No.: US 9,425,161 B2
(45) Date of Patent: Aug. 23, 2016

(54) SEMICONDUCTOR DEVICE WITH MECHANICAL LOCK FEATURES BETWEEN A SEMICONDUCTOR DIE AND A SUBSTRATE

(71) Applicant: FREESCALE SEMICONDUCTOR, INC., Austin, TX (US)

(72) Inventors: Lakshminarayan Viswanathan, Phoenix, AZ (US); L. M. Mahalingam, Scottsdale, AZ (US); David F. Abdo, Scottsdale, AZ (US); Jaynal A. Molla, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/808,779

(22) Filed: Jul. 24, 2015

(65) Prior Publication Data
US 2015/0333031 A1 Nov. 19, 2015

Related U.S. Application Data

(62) Division of application No. 14/089,744, filed on Nov. 25, 2013, now Pat. No. 9,099,567.

(51) Int. Cl.
*H01L 23/52* (2006.01)
*H01L 23/00* (2006.01)
(Continued)

(52) U.S. Cl.
CPC .............. *H01L 24/73* (2013.01); *B23K 20/002* (2013.01); *B23K 20/023* (2013.01); *B23K 20/10* (2013.01); *B23K 20/16* (2013.01); *B23K 20/24* (2013.01); *B23K 35/0244* (2013.01); *H01L 23/3107* (2013.01); *H01L 24/29* (2013.01); *H01L 24/32* (2013.01); *H01L 24/49* (2013.01);
(Continued)

(58) Field of Classification Search
USPC .......................................................... 257/782
See application file for complete search history.

(56) References Cited

U.S. PATENT DOCUMENTS

| | | | | |
|---|---|---|---|---|
| 5,278,446 A | * | 1/1994 | Nagaraj | H01L 23/16 257/667 |
| 5,701,034 A | * | 12/1997 | Marrs | H01L 21/4882 257/706 |

(Continued)

OTHER PUBLICATIONS

Masson, et al., "High Temperature Die-Attaches for SiC Power Devices," Proceedings of the 2011—14th European Conference on Power Electronics and Applications, pp. 1-10, Aug. 2011.

(Continued)

*Primary Examiner* — Luan C Thai
(74) *Attorney, Agent, or Firm* — Sherry W. Schumm

(57) ABSTRACT

An embodiment of a method of attaching a semiconductor die to a substrate includes placing a bottom surface of the die over a top surface of the substrate with an intervening die attach material. The method further includes contacting a top surface of the semiconductor die and the top surface of the substrate with a conformal structure that includes a non-solid, pressure transmissive material, and applying a pressure to the conformal structure. The pressure is transmitted by the non-solid, pressure transmissive material to the top surface of the semiconductor die. The method further includes, while applying the pressure, exposing the assembly to a temperature that is sufficient to cause the die attach material to sinter. Before placing the die over the substrate, conductive mechanical lock features may be formed on the top surface of the substrate, and/or on the bottom surface of the semiconductor die.

19 Claims, 6 Drawing Sheets

(51) Int. Cl.
  B23K 20/02 (2006.01)
  B23K 35/02 (2006.01)
  B23K 20/24 (2006.01)
  B23K 20/16 (2006.01)
  B23K 20/10 (2006.01)
  B23K 20/00 (2006.01)
  H01L 23/31 (2006.01)
  H05K 3/28 (2006.01)
(52) U.S. Cl.
  CPC .............. *H01L 24/75* (2013.01); *H01L 24/83* (2013.01); *H01L 24/95* (2013.01); *H01L 24/48* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29339* (2013.01); *H01L 2224/32225* (2013.01); *H01L 2224/32238* (2013.01); *H01L 2224/32245* (2013.01); *H01L 2224/32258* (2013.01); *H01L 2224/48091* (2013.01); *H01L 2224/48106* (2013.01); *H01L 2224/48137* (2013.01); *H01L 2224/48227* (2013.01); *H01L 2224/48247* (2013.01); *H01L 2224/73265* (2013.01); *H01L 2224/75315* (2013.01); *H01L 2224/75317* (2013.01); *H01L 2224/8348* (2013.01); *H01L 2224/8384* (2013.01); *H01L 2224/83192* (2013.01); *H01L 2224/83203* (2013.01); *H01L 2224/83365* (2013.01); *H01L 2224/83385* (2013.01); *H01L 2224/83439* (2013.01); *H01L 2224/83444* (2013.01); *H01L 2224/83447* (2013.01); *H01L 2224/83455* (2013.01); *H01L 2224/83484* (2013.01); *H01L 2224/92247* (2013.01); *H01L 2924/00014* (2013.01); *H01L 2924/01005* (2013.01); *H01L 2924/01006* (2013.01); *H01L 2924/01322* (2013.01); *H01L 2924/04541* (2013.01); *H01L 2924/04642* (2013.01); *H01L 2924/0503* (2013.01); *H01L 2924/1306* (2013.01); *H01L 2924/15747* (2013.01); *H01L 2924/15786* (2013.01); *H01L 2924/181* (2013.01); *H05K 3/284* (2013.01); *H05K 2201/09872* (2013.01); *H05K 2201/2072* (2013.01); *H05K 2203/1322* (2013.01)

(56) References Cited

U.S. PATENT DOCUMENTS

| | | | |
|---|---|---|---|
| 6,177,726 | B1 | 1/2001 | Manteghi |
| 6,184,064 | B1 | 2/2001 | Jiang et al. |
| 6,313,514 | B1 | 11/2001 | Winterer et al. |
| 7,429,790 | B2 | 9/2008 | Condie et al. |
| 7,705,472 | B2 | 4/2010 | Mahler et al. |
| 8,257,795 | B2 | 9/2012 | Lu et al. |
| 8,555,491 | B2 | 10/2013 | Boureghda et al. |
| 8,866,312 | B2 | 10/2014 | Tani et al. |
| 2009/0025967 | A1 | 1/2009 | Boureghda et al. |
| 2012/0291454 | A1 | 11/2012 | Kahler et al. |

OTHER PUBLICATIONS

Hascoet et al., "Pressureless Silver Sintering Die-Attach for SiC Power Devices," European Conference on Silicon Carbide and Related Materials (ESCRM), pp. 1-4, Sep. 2012.

Gobl, et al., "Low Temperature Sinter Technology Die Attachment for Power Electronic Applications," Conference on Integrated Power Electronics Systems (CIPS), pp. 1-5, Mar. 2010.

Zhang, Zhiye "Processing and Characterization of Micro-scale and Nanoscale Silver Paste for Semiconductor Device Attachment," PhD Dissertation submitted to Virginia Polytechnic Institute, pp. 1-188, Sep. 2005.

Bai, Guofeng "Low-Temperature Sintering of Nanoscale Silver Paste for Semiconductor Device Interconnection," PhD Dissertation submitted to Virginia Polytechnic Institute, pp. 1-215, Oct. 2005.

\* cited by examiner

US 9,425,161 B2

SEMICONDUCTOR DEVICE WITH MECHANICAL LOCK FEATURES BETWEEN A SEMICONDUCTOR DIE AND A SUBSTRATE

RELATED APPLICATION

This patent application is a divisional of U.S. patent application Ser. No. 14/089,744, filed on Nov. 25, 2013, and issued as U.S. Pat. No. 9,099,567.

TECHNICAL FIELD

Embodiments of the subject matter described herein relate generally to packaged semiconductor devices that include one or more semiconductor die attached to a substrate, and die attach methods used in fabricating packaged semiconductor devices.

BACKGROUND

In the process of fabricating packaged semiconductor devices, adhesive and eutectic die attach methods are two of the most commonly used techniques for attaching semiconductor die to a substrate (e.g., a leadframe, flange, or other substrate). Adhesive die attach methods typically use non-conductive adhesives (e.g., polymer adhesives or epoxies) as die attach material to mount the semiconductor die to the substrate.

In contrast, standard eutectic die attach methods typically use preforms or pastes of conductive eutectic alloys to bond the semiconductor die to the substrate. For example, commonly used die attach materials for standard eutectic die attach processes include pure gold (Au), gold-containing alloys (e.g., gold-tin (Au—Sn)), and lead-containing alloys (e.g., lead-silver-indium (Pb—Ag—In), lead-silver-tin (Pb—Ag—Sn), and lead-tin (Pb—Sn)). When pure gold is used to attach silicon (Si) or germanium (Ge) die to a substrate, for example, the silicon or germanium from the die diffuses into the gold during an initial heating process, forming gold-silicon (Au—Si) or gold-germanium (Au—Ge) eutectic alloys, respectively.

A significant disadvantage to using gold as a die attach material for a eutectic die attach process is the relatively high cost of gold when compared with other materials. However, potential environmental issues and waste disposal costs associated with using lead-containing die attach materials also is a significant factor to consider in determining which eutectic die attach material to use.

Die attach methods also may be classified as pressurized or pressureless methods. Using a pressurized die attach method, after placing the die over the die attach material and the substrate, special equipment is used to press against the top surface of the die in order to compress the die toward the substrate during the heating process. More specifically, the special equipment used to compress the die toward the substrate may include specially machined or formed solids (e.g., metals, ceramics and/or polymers) for each configuration of dies and substrates. In contrast, pressureless die attach methods do not use such special, pressure-applying equipment, and the device experiences only ambient pressure during the die attach process.

In general, pressureless die attach methods tend to yield devices with larger and/or more plentiful voids in the die attach material. These voids may significantly affect the robustness, performance, and reliability of the packaged device. More specifically, large voids in the die attach material may result in relatively low thermal and/or electrical conductivity between the die and the substrate, and/or may yield assemblies with low die shear strength. In addition, die may be more prone to cracking when the die attach material includes relatively large voids. In contrast, pressurized die attach methods may yield devices with relatively small voids in the die attach material. However, the mechanical stresses imparted upon the die during a pressurized die attach process are more likely to lead to die cracking, thus potentially decreasing manufacturing yields.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Figure 1:
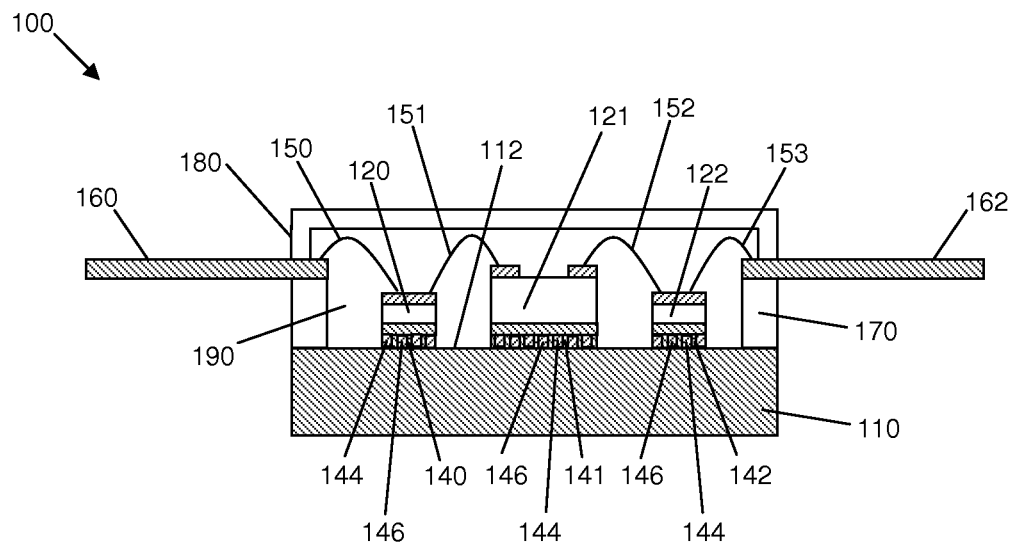
FIG. 1 illustrates a cross-sectional, side view of an electronic device housed in an air cavity package, in accordance with an example embodiment.

FIG. 1 illustrates a cross-sectional, side view of an electronic device 100 housed in an air cavity package, in accordance with an example embodiment. Device 100 includes a substrate 110, multiple semiconductor die 120, 121, 122, sintered metallic layers 140, 141, 142, wirebonds 150, 151, 152, 153, and leads 160, 162. In addition, device 100 includes isolation structure 170 and lid 180, in an embodiment. As will be discussed in more detail later, sintered metallic layers 140-142 function as die attach structures, in an embodiment. According to a further embodiment, device 100 includes mechanical lock features 144, 146.

The cross-sectional view of substrate 110 indicates that the substrate 110 may be formed from a single, homogenous conductive material, in an embodiment. For example, substrate 110 may be formed from copper (Cu), a copper alloy, or other bulk conductive materials. Alternatively, in some embodiments, substrate 110 may be formed from an integrated combination of multiple materials, such as a bulk conductive material that is integrated with one or more other materials. For example, one or more bulk conductive materials such as copper, a copper alloy, silver (Ag), aluminum (Al), and/or other bulk materials in molten or other structural forms may be integrated with tungsten (W), molybdenum (Mo), diamond, graphite, silicon carbide (SiC), boron nitride (BN), or other materials in skeletal, particle (e.g., microscopic or macroscopic particles, fibers, flakes, or other discrete forms), or other structural forms. As a non-limiting example, a copper tungsten flange may be formed from an integrated combination of tungsten in a skeletal form with molten copper infiltrated throughout the tungsten structure. As other non-limiting examples, a copper diamond flange may be formed from an integrated combination of copper and diamond particles, a copper SiC flange may be formed from an integrated combination of copper and SiC fibers, a copper graphite flange may be formed from an integrated combination of copper and graphite flakes, and so on. In various alternate embodiments, a flange may be formed from a composite of multiple layers of conductive materials.

In an alternate embodiment, substrate 110 may include ceramic or organic bulk materials (e.g., standard printed circuit board (PCB) materials) with a conductive layer on the top surface of the bulk materials. Such a substrate also may include through substrate vias, edge conductors, and/or other conductive features that facilitate electrical connection with the top conductive material. For example, the conductive material layer may include Cu, W, Mo, Ag, nickel (Ni), gold (Au), some combination thereof, or another suitable material.

Although not shown in FIG. 1, the top surface 112 of substrate 110 and/or the bottom surfaces (or bottom contacts) of semiconductor die 120-122 may be coated or plated with one or more additional conductive material layers (not illustrated). For example, the additional conductive material layer(s) may include Ni, Au, Ag, Cu, tin (Sn), or other suitable materials.

According to an embodiment, sintered metallic layers 140-142 include a metallic material that is capable of assuming a solid, rigid structure when sintered. For example, sintered metallic layers 140-142 may be formed from materials selected from sintered silver, sintered gold, sintered copper, sintered nickel, and sintered palladium, in various embodiments. According to a further embodiment, the material forming sintered metallic layers 140-142 may include one or more additives. For example, the additive(s) may include materials (e.g., graphene, diamond particles, silicon carbide, titanium carbide, boron nitride, or other suitable materials) that may increase the thermal conductivity of the die attach material during operation of the device.

According to an embodiment, mechanical lock features 144, 146 are included on the top substrate surface 112 and/or the bottom die surfaces, respectively. Mechanical lock features 144, 146 are correspondingly arranged with respect to each other and are configured to increase the strength of the die attachment (e.g., increase die shear strength). For example, mechanical lock features 144, 146 may be configured to mesh together within a common plane (e.g., similar to a tongue-in-groove arrangement), while allowing the sintered material of sintered metallic layers 140-142 to flow between the mechanical lock features 144, 146 during the sintering process. According to an embodiment, the mechanical lock features 144, 146 are formed from one or more conductive materials, such as Ni, Au, Ag, Cu, Sn, or other suitable materials. In alternate embodiments, either or both of mechanical lock features 144, 146 may be excluded from device 100.

Semiconductor die 120-122 and wirebonds 150-153 form portions of a circuit, which is electrically coupled between input lead 160 and an output lead 162 of the device 100. Although leads 160, 162 are described herein as input and output leads, leads of the device 100 may serve other functions, as well (e.g., supplying power, ground, control signals, or other functions). According to the illustrated embodiment, leads 160, 162 have a straight configuration. In alternate embodiments, leads 160,162 may have a "gull wing" or other configuration. In still other alternate embodiments, a device may be housed in a pinned package (e.g., a pin grid array (PGA) package), a chip carrier package, a ball grid array (BGA) package, a surface mount package (e.g., a land grid array (LGA) package), a leadless package (e.g., a flat no-leads package such as a dual flat no-leads (DFN) or quad flat no-leads (QFN) package), or in another type of package.

Either way, the circuit included within device 100 may include components of any of various types of circuits, including a power amplifier, a processor, a sensor device, and so on. For example, the circuit may include one or more vertical field effect transistors (FETs) 121, one or more capacitors 120 on an input side of the FET(s) 121, one or more capacitors 122 on an output side of the FET(s) 121, and a plurality of inductive elements, some of which may be formed from the wirebonds 140-153. According to a particular embodiment, the FET(s) 121 may form portions of a power amplifier stage, and the capacitors 120, 122 and inductive elements may form portions of input and output impedance matching circuits. Although a power amplifier is a type of circuit that may implement or be produced using various embodiments, it should be understood that a wide variety of different types of circuits may be included in device 100.

When device 100 is incorporated into an electronic system, substrate 110 may serve as a conduit to a reference voltage (e.g., ground) of the electronic system. In such an embodiment, some of the electrical components may include conductive contacts that correspond to terminals of the various electrical components. For example, each of capacitors 120, 122 may include top and bottom conductive contacts (as shown), where each top conductive contact corresponds to a first terminal of the capacitor, and each bottom conductive contact corresponds to a second terminal of the capacitor. In the configuration illustrated in FIG. 1, for example, since each capacitor 120, 122 includes a bottom conductive contact coupled to substrate 110, each capacitor 120, 122 may represent a shunt capacitor to ground.

Similarly, FET 121 may include conductive gate and source contacts on a top surface of the FET 121 (e.g., top left and top right contacts, respectively), and a conductive drain contact on a bottom surface of the FET 121. Accordingly, when an appropriate voltage signal is applied to the gate contact, current may flow between the source and drain contacts. Since the drain contact is coupled to substrate 110, the drain of the FET 121 accordingly may be coupled to the reference voltage (e.g., ground) through the substrate 110.

According to a further embodiment, the input and output leads 160, 162 are electrically insulated from the substrate 110 by insulating structure 170. For example, the insulating structure 170 may have a window frame type of configuration, which includes sides proximate to the edges of the top surface 112 of the substrate 110, and a central opening through which the top surface 112 is exposed (e.g., for attachment of semiconductor die 120-122). Insulating structure 170 may be formed from ceramic, printed circuit board materials, and/or other dielectric materials, in various embodiments.

In addition, and as mentioned above, device 110 may further include a lid 180. Along with the top surface 112 of the substrate 110, the isolation structure 170 and the lid 180 define an air cavity 190 within which the semiconductor die 120-122, wirebonds 150-153, and portions of leads 160, 162 are disposed. The lid 180 may be formed from ceramic, plastic, or some other material, in various embodiments.

Figure 2:
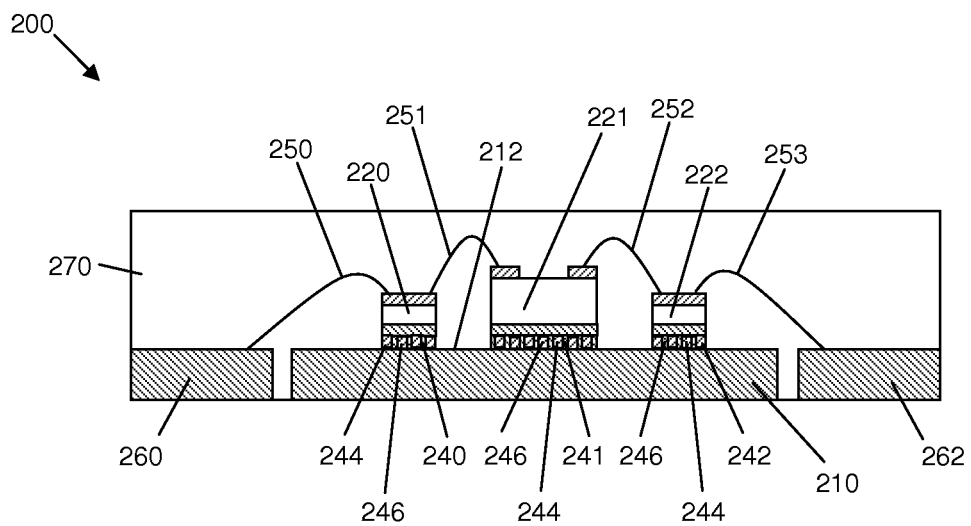
FIG. 2 illustrates a cross-sectional, side view of an electronic device housed in an encapsulated package, in accordance with another example embodiment.

FIG. 1 illustrates an embodiment of a device 100 that is housed in an air cavity package. In contrast, FIG. 2 illustrates a cross-sectional, side view of an electronic device 200 housed in an encapsulated package, in accordance with another example embodiment. Similar to the device 100 of FIG. 1, the device 200 of FIG. 2 includes a substrate 210, multiple semiconductor die 220, 221, 222, sintered metallic layers 240, 241, 242, wirebonds 250, 251, 252, 253, and leads 260, 262. In addition, according to a further embodiment, device 200 may include mechanical lock features 244, 246. In contrast with FIG. 1, however, device 200 further includes encapsulation 270 that provides electrical isolation and maintains the substrate 210, die 220-222, wirebonds 250-253, leads 260, 262 in a fixed orientation with respect to each other. Encapsulation 270 may include one or more organic materials, such as one or more polymers (e.g., an epoxy) or other suitable materials.

As with the embodiment of FIG. 1, substrate 210 may be formed from a single, homogenous conductive material (e.g., Cu, a copper alloy, or other bulk conductive materials), an integrated combination of multiple materials (e.g., one or more bulk conductive materials such as Cu, a copper alloy, Ag, Al, and/or other bulk materials in molten or other structural forms that may be integrated with W, Mo, diamond, graphite, SiC, BN, or other materials in skeletal, particle, or other structural forms). Alternatively, substrate 210 may include ceramic or organic bulk materials with a conductive layer (e.g., Cu, W, Mo, Ag, Ni, Au, some combination thereof, or another suitable material) on the top surface of the bulk materials. In addition, although not shown in FIG. 2, the top surface 212 of substrate 210 and/or the bottom surfaces (or bottom contacts) of semiconductor die 220-222 may be coated or plated with one or more additional conductive material layers (e.g., Ni, Au, Ag, Cu, Sn, or other suitable materials).

Sintered metallic layers 240-242 are analogous to sintered metallic layers 140-142 (FIG. 1), and may include a metallic material that is capable of assuming a solid rigid structure when sintered (e.g., sintered silver, sintered gold, sintered copper, sintered nickel, and sintered palladium). According to a further embodiment, the material forming sintered metallic layers 240-242 may include one or more additives (e.g., graphene, diamond particles, silicon carbide, titanium carbide, boron nitride, or other suitable materials) that are configured to increase the thermal conductivity of the die attach material.

According to an embodiment, mechanical lock features 244, 246 analogous to mechanical lock features 144, 146 (FIG. 1) are included on the top substrate surface 212 and/or the bottom die surfaces, respectively. In alternate embodiments, either or both of mechanical lock features 244, 246 may be excluded from device 200.

Semiconductor die 220-222 and wirebonds 250-253 form portions of a circuit, which is electrically coupled between input lead 260 and an output lead 262 of the device 200. According to an embodiment, during manufacture of device 200, leads 260, 262 and substrate 210 may form portions of a leadframe (i.e., a structure in which substrate 210 and leads 260, 262 are structurally connected by sacrificial elements that are removed after encapsulation). As illustrated, the leads 260, 262 and substrate 210 may have substantially co-planar bottom surfaces, yielding a leadless type of package (e.g., a DFN or QFN package). In alternative embodiments, leads 260, 262 may not be co-planar with substrate 210 and/or may extend beyond the perimeter of substrate 210. In still other alternate embodiments, the device may be housed in a pinned package, a chip carrier package, a BGA package, a surface mount package, or in another type of package.

Figure 3:
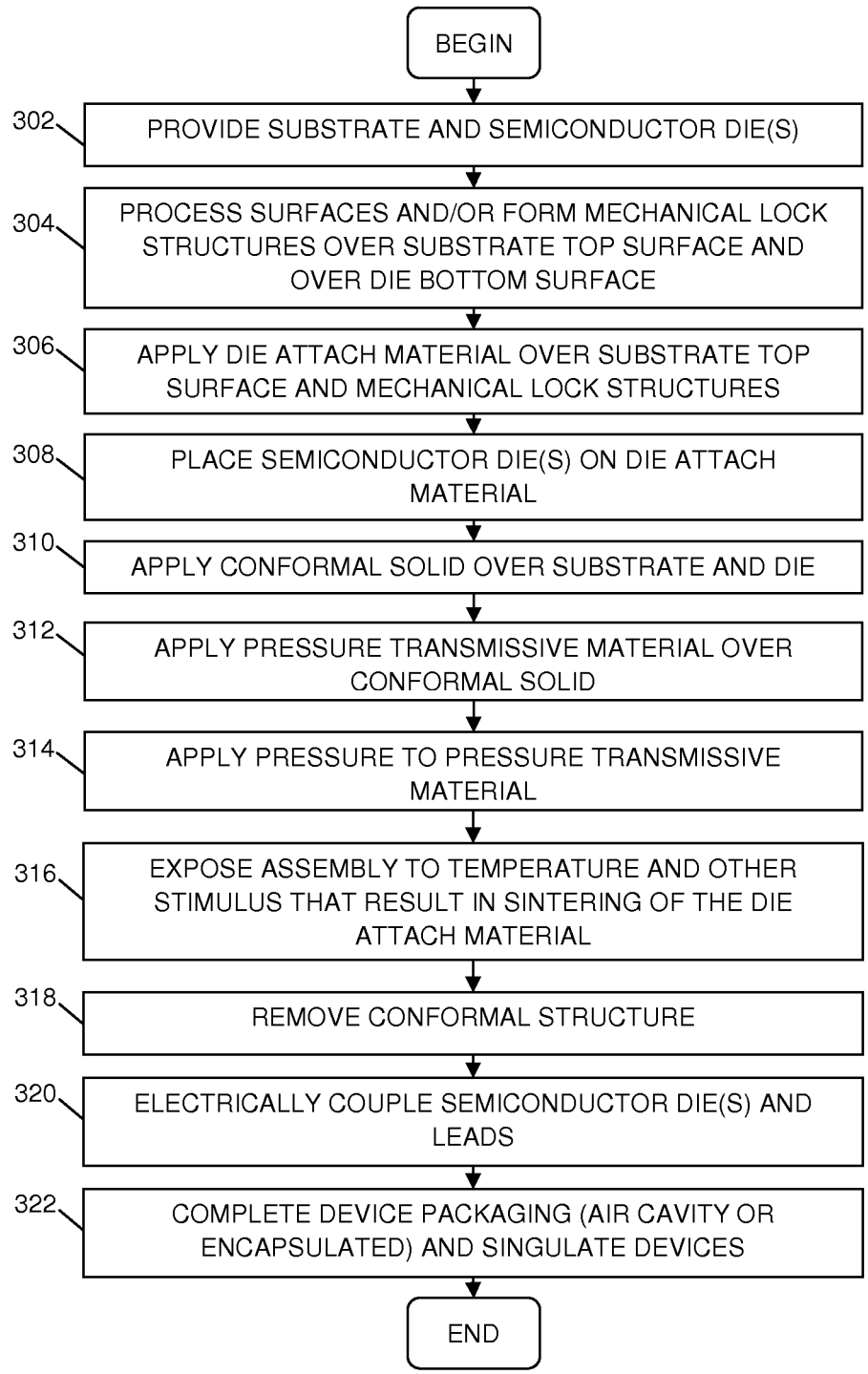
FIG. 3 is a flowchart of a method of fabricating a packaged electronic device, in accordance with an example embodiment.

FIG. 3 is a flowchart of a method of fabricating a packaged electronic device (e.g., device 100 or 200, FIGS. 1, 2), in accordance with an example embodiment. For enhanced understanding, FIG. 3 should be viewed in parallel with FIGS. 4-12, where FIG. 4 illustrates a top view of a substrate strip 400, and FIGS. 5-12 illustrate cross-sectional, side views of the electronic device of FIG. 1 at several stages of fabrication, in accordance with various example embodiments.

Figure 4:
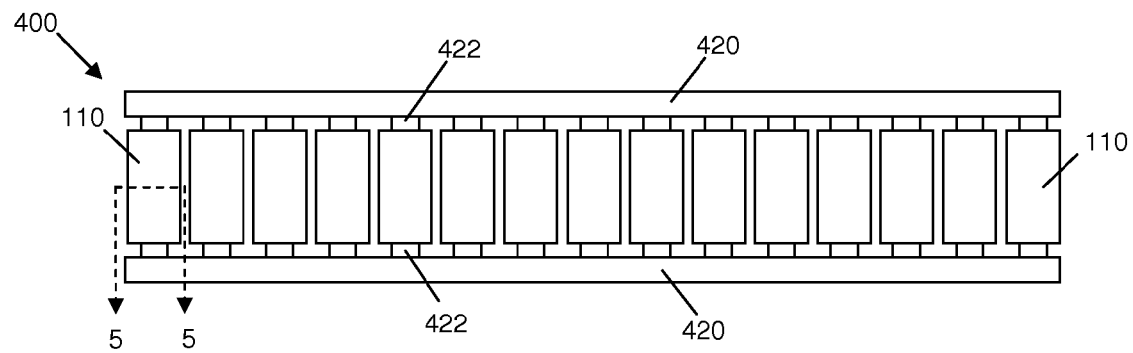
FIG. 4 illustrates a top view of a substrate strip, in accordance with an example embodiment.
Figure 5:
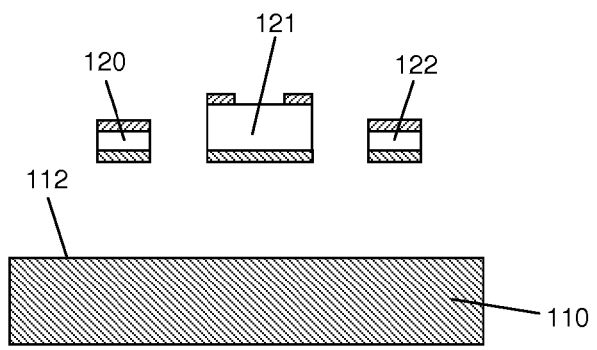
FIGS. 5-12 illustrate cross-sectional, side views of the electronic device of FIG. 1 at several stages of fabrication, in accordance with various example embodiments.

Referring to FIGS. 3-5, the method may begin, in block 302, by providing a substrate 110 (FIGS. 1, 4, 5) and one or more semiconductor dies 120-122 (FIGS. 1, 5) to be bonded to the substrate 110. According to an embodiment, the substrate 110 may form a portion of a structure that includes multiple interconnected substrates, such as strip 400, which includes a plurality of substrates 110 that are structurally coupled together by one or more sacrificial rails 420 and sacrificial connectors 422. The substrates 110, rails 420, and connectors 422 may be integrally formed from the same material(s), in an embodiment, or the substrates 410, rails 420, and connectors 422 may be formed as distinct structures that are coupled together, in other embodiments. In still other embodiments, substrate 110 may form a portion of an array of multiple interconnected substrates (e.g., a structure that includes rows and columns of substrates coupled together with sacrificial features) or a differently configured leadframe or other structure. Either way, the use of a substrate strip 400, a substrate array, or a multiple substrate leadframe enables a plurality of devices to be manufactured in parallel, rather than being manufactured one at a time. In an alternate embodiment, each device may be fabricated one at a time (e.g., each substrate could be distinct and not interconnected with any other substrates). For clarity, fabrication of a single device is illustrated and described in conjunction with FIGS. 5-11. More specifically, FIG. 5 illustrates a cross sectional view of substrate 110 along line 5-5 of FIG. 4, along with semiconductor dies 120-122, which are not depicted in FIG. 4. It should be understood that the process described in conjunction with FIGS. 3 and 5-11 could be carried out in parallel when a substrate strip 400 or other multiple substrate structure is used.

According to an embodiment, and as discussed previously, substrate 110 may be formed from a single, homogenous conductive material (e.g., Cu, a copper alloy, or other bulk conductive materials), an integrated combination of multiple materials (e.g., one or more bulk conductive materials such as Cu, a copper alloy, Ag, Al, and/or other bulk materials in molten or other structural forms that may be integrated with W, Mo, diamond, graphite, SiC, BN, or other materials in skeletal, particle, or other structural forms). Alternatively, substrate 110 may include ceramic or organic bulk materials with a conductive layer (e.g., Cu, W, Mo, Ag, Ni, Au, some combination thereof, or another suitable material) on the top surface of the bulk materials. In addition, according to various embodiments, the top surface 112 of substrate 110 and/or the bottom surfaces (or bottom contacts) of semiconductor die 120-122 may be coated or plated with one or more additional conductive material layers (e.g., Ni, Au, Ag, Cu, Sn, or other suitable materials).

Figure 6:
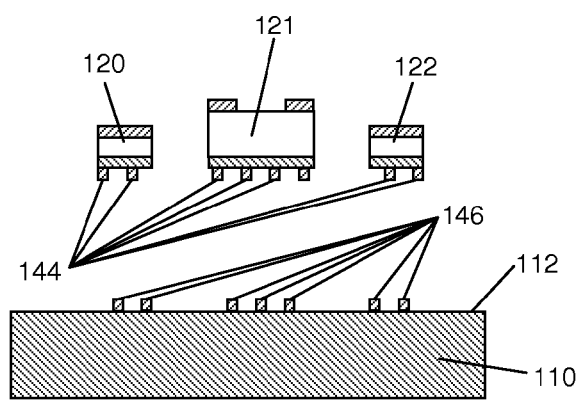

Referring again to FIG. 3 and also to FIG. 6, in block 304, the top surface 112 of the substrate 110 and/or the bottom surfaces of the semiconductor die 120-122 may be processed to improve the substrate-to-die attach material and/or die-to-die attach material interfaces. For example, according to various embodiments, either or both the substrate top surface 112 and the die bottom surfaces may be etched, mechanically treated, or otherwise processed to increase the roughness of the surface(s) and to increase the affinity of the surfaces to the material of the sintered metallic layer (e.g., layer 140-142) that will subsequently couple the substrate 110 and die 120-122 together.

According to a particular embodiment, in addition to or in lieu of processing the surfaces, mechanical lock structures 144, 146 may be formed on or over the bottom surfaces of the die 120-122 and/or the top surface 112 of the substrate 110. For example, mechanical lock structures 144 may be formed by chemically etching the bottom surfaces of the semiconductor die 120-122 and/or of a layer of material deposited over the bottom surfaces of the semiconductor die 120-122. Similarly, mechanical lock structures 146 may be formed by chemically etching the top surface 112 of the substrate 110 and/or a layer of material deposited over the top surface 112 of the substrate 110. In alternate embodiments, the mechanical lock structures 144, 146 may be formed by sputter etching metallization on the die and/or substrate surfaces, by selectively plating the die and/or substrate surfaces, and/or by mechanically treating the die and/or substrate surfaces. In still other alternate embodiments, the mechanical lock structures 144, 146 may be excluded.

Figure 7:
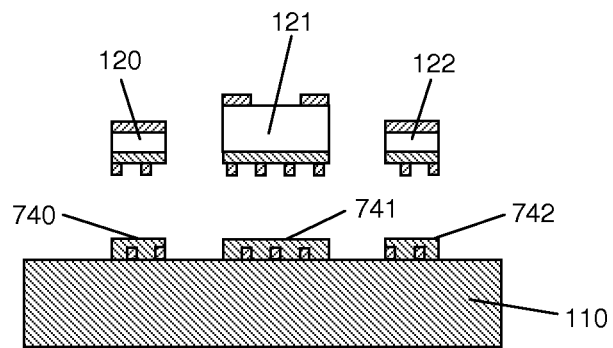

Referring again to FIG. 3 and also to FIG. 7, in block 306, die attach material 740, 741, 742 is applied over the top surface 112 of the substrate 110 at least in the areas at which semiconductor die 120-122 ultimately will be attached. In addition or alternatively, the die attach material 740-742 may be applied over the bottom surfaces of the die 120-122. At the time of application, the die attach material 740-742 may be in the form of a paste, a film, a preform, or other suitable form. According to various embodiments, the die attach material 740-742 includes particles of one or more metallic materials that are capable of assuming a solid rigid structure when exposed to conditions suitable for sintering (e.g., elevated temperatures). In other words, the die attach material includes metallic particles configured to produce a sintered metal when exposed to a temperature sufficient for sintering to occur. For example, the die attach material 740-742 may include particles of silver, gold, copper, nickel, palladium, and/or other sinterable materials. The particles may have sizes in a range of about 10 nanometers (nm) to about 100 nm, in an embodiment, although the particles may be smaller or larger, as well. According to an embodiment, the particles are coated with one or more materials that retard oxidation and/or prevent agglomeration of the particles prior to sintering (e.g., that prevent agglomeration at non-elevated, ambient temperatures).

In addition to particles of a metallic material, die attach material 740-742 also may include one or more additive materials (e.g., graphene, diamond particles, silicon carbide, titanium carbide, boron nitride, or other suitable materials) that are configured to increase the thermal conductivity of the die attach material 740-742 during operation of the device.

Figure 8:
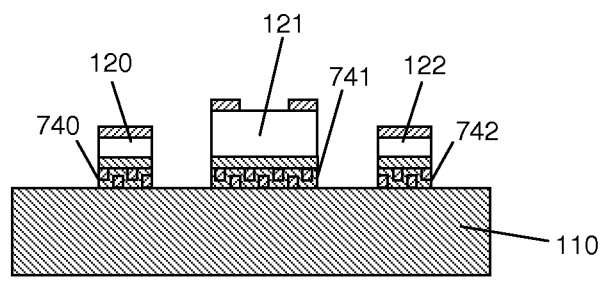

Referring again to FIG. 3 and also to FIG. 8, in block 308, the semiconductor dies 120-122 are placed on the die attach material 740-742. This results in the formation of an assembly that includes the substrate 110, the die attach material 740-742, and the semiconductor die 120-122. According to an embodiment, the semiconductor dies 120-122 and the substrate 110 may be brought together so that the mechanical lock features 144, 146, if included, essentially mesh together while allowing die attach material 740-742 to enter the spaces between the mechanical lock features 144, 146.

Figure 9:
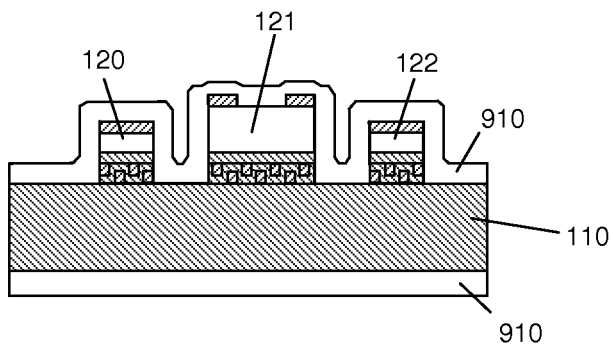

Referring again to FIG. 3 and also to FIG. 9, in block 310, a conformal solid 910 may be applied over the top surfaces of the substrate 110 and the semiconductor dies 120-122. In addition, in an embodiment, the conformal solid 910 may be applied to the bottom surface of the substrate 110, and/or may substantially surround the assembly. The conformal solid 910 may adhere to the substrate and die surfaces, or may merely conform to their surfaces without adhesion. Either way, the conformal solid 910 is configured to maintain the dies 120-122 and substrate 110 in substantially fixed physical orientations with respect to each other during sintering. In addition, as will be discussed later, the conformal solid 910 is readily removable once the sintering process is completed. According to various embodiments, the conformal solid 910 may be formed from one or more pliable organic or inorganic, conductive or non-conductive materials and/or layers. For example, but not by way of limitation, the conformal solid 910 may include a conformal film (e.g., of polytetrafluoroethylene (PTFE), perfluoroalkoxy (PFA), or some other material), a conformal foil (e.g., a metallic foil), or another solid conformal material (e.g., glass or some other solid material layer). Whichever material is used, the conformal solid 910 includes a material that will remain solid when later exposed (e.g., in block 316) to a temperature that is sufficient to cause the die attach material 740-742 to sinter. The conformal solid 910 may have a thickness in a range of about 10 microns to about 40 microns, although the conformal solid 910 may be thinner or thicker, as well. In an alternate embodiment, block 310 may be excluded from the process (e.g., the conformal solid 910 may not be applied).

Figure 10:
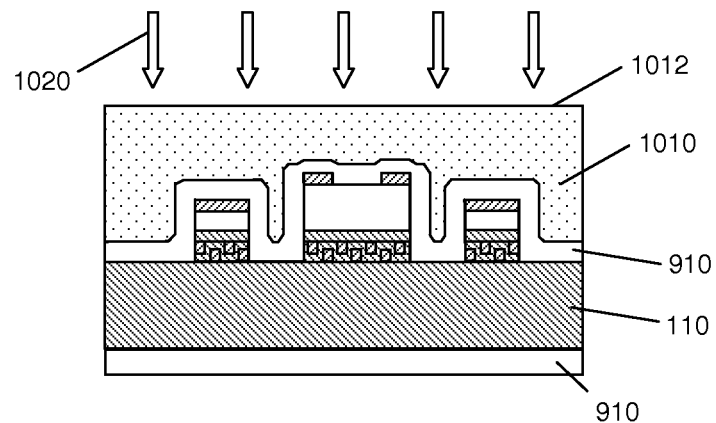
Figure 11:
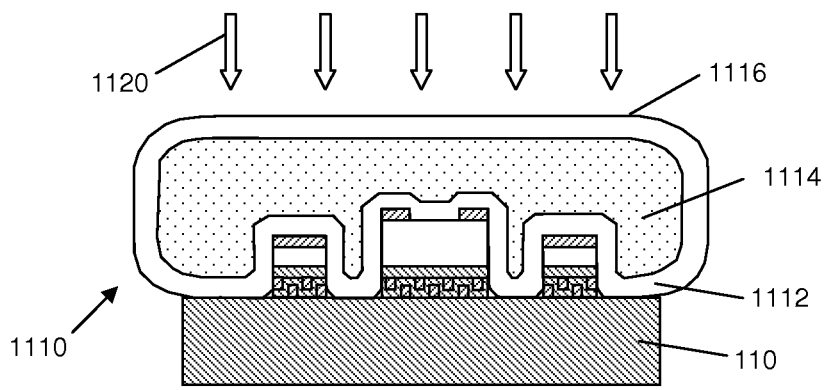

Referring again to FIG. 3 and also to FIG. 10, in block 312, a non-solid, pressure transmissive material 1010 is applied or disposed over the conformal solid 910, in an embodiment. In an alternate embodiment in which the conformal solid 910 is not used, the pressure transmissive material 1010 may be applied directly over the top surfaces of the substrate 110 and semiconductor dies 120-122. As with the conformal solid 910, the pressure transmissive material 1010 will later be removed, as discussed below, and will not form a portion of the completed device. Desirably, a sufficient quantity of the pressure transmissive material 1010 is disposed over the semiconductor die 120-122 so that the material completely covers the top surfaces of the die 120-122. In other words, some quantity of pressure transmissive material 1010 is present between the die top surfaces and the top surface 1012 of the pressure transmissive material 1010.

According to various embodiments, the pressure transmissive material 1010 may be any of a variety of liquids, gasses, pastes, putties, or gels. Essentially, the pressure transmissive material 1010 has the quality of being capable of transmitting pressure to the top surfaces of the die 120-122 when pressure is applied to the pressure transmissive material 1010. In addition, the pressure transmissive material 1010 should include a material that will not significantly degrade when later exposed (e.g., in block 316) to a temperature that is sufficient to cause the die attach material 740-742 to sinter. For example, the pressure transmissive material 1010 may be a viscous compressible fluid (e.g., uncured molding compound, oil, epoxy, and so on), which is capable of conveying hydrostatic pressure to the top surfaces of the semiconductor die 120-122 when pressure is applied to the pressure transmissive material 1010 during subsequent processing steps. In such an embodiment, the pressure transmissive material 1010 may be contained (e.g., using structures not illustrated in FIG. 10) so that the pressure transmissive material 1010 will remain in place during subsequent application of pressure to the pressure transmissive material 1010. For example, the assembly that includes the substrate 110, dies 120-122, and conformal solid 910 may be positioned within an opening in a mold or other open-top structure, and the sidewalls of the mold or structure may retain the pressure transmissive material 1010 during subsequent processing steps. Other techniques also could be used to keep the pressure transmissive material 1010 in place during subsequent processing steps, as well. In an alternate embodiment, the pressure transmissive material 1010 may be a viscous conformal material when it is applied, and subsequently may be cured or otherwise processed to convert the previously viscous conformal material into a solid state.

The conformal solid 910 and the pressure transmissive material 1010 may be considered to be a "conformal structure" that is brought into contact with the top surfaces of the semiconductor die 120-122 and the substrate 110. In an alternate embodiment, the "conformal structure" may have a different form. For example, the conformal structure may be self contained. For example, in an alternate embodiment, rather than performing the distinct steps of applying a conformal solid 910 and subsequently applying a pressure transmissive material 1010 as shown in FIGS. 9 and 10, a conformal structure that includes both a conformal solid and a pressure transmissive material may instead be brought into contact with the top surfaces of the semiconductor die 120-122 and the substrate 110. For example, the conformal structure may take the form of a solid container, which contains the pressure transmissive material.

Figure 12:
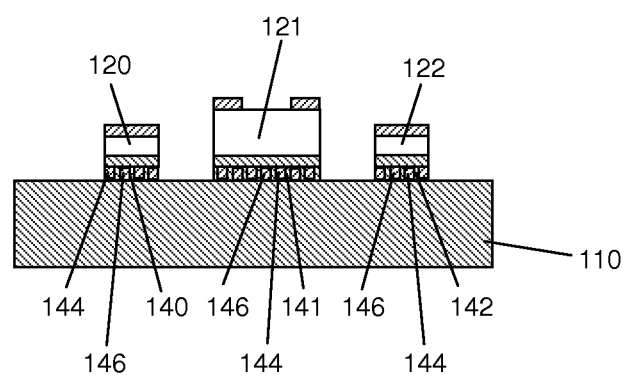

To further illustrate such an embodiment, FIG. 12 illustrates a cross-sectional, side view of the assembly of FIG. 8 after a self-contained conformal structure 1110 has been brought into contact with the top surfaces of the semiconductor die 120-122 and the substrate 110, in accordance with another example embodiment. According to an embodiment, the conformal structure 1110 includes a conformal solid in the form of a solid conformal container 1112 and a non-solid, pressure transmissive material 1114. For example, the conformal container 1112 may be a balloon, a bag, or another type of container. As used herein, a "balloon" refers to a container that has a size that may vary in response to pressure asserted on an inside of the balloon by the non-solid, pressure transmissive material 1114, and a "bag" refers to a container that has a size that does not significantly vary in response to pressure asserted on an inside of the bag by the non-solid, pressure transmissive material 1114. In either embodiment, however, the material of the conformal container 1112 is such that it conforms to the shape of the top surfaces of the semiconductor die 120-122 and the substrate 110 when it is brought into contact with them. As with conformal solid 910, the conformal container 1112 is formed from one or more materials that will remain solid when later exposed (e.g., in block 316) to a temperature that is sufficient to cause the die attach material 740-742 to sinter. In addition, as with pressure transmissive material 1010, pressure transmissive material 1114 may be any of a variety of liquids, gasses, pastes, putties, or gels, and pressure transmissive material 1114 is capable of transmitting pressure to the top surfaces of the die 120-122 when pressure is applied to the pressure transmissive material 1114. In addition, the pressure transmissive material 1114 should include a material that will not significantly degrade when later exposed (e.g., in block 316) to a temperature that is sufficient to cause the die attach material 740-742 to sinter. According to some embodiments, the conformal container 1112 may be filled with the pressure transmissive material 1114 prior to bringing the conformal container 1112 into contact with the semiconductor die 120-122. According to other embodiments, the conformal container 1112 may come into contact with the semiconductor die 120-122 before or during the process of filling the conformal container 1112 with the pressure transmissive material 1114.

Referring again to FIG. 3, the die attach material 740-742 is then sintered through execution of blocks 314 and 316. More specifically, in block 314, an elevated pressure (indicated by arrows 1020 in FIG. 10 and arrows 1120 in FIG. 11) may be applied directly to the pressure transmissive material or to the conformal structure that includes the pressure transmissive material. For example, referring to FIG. 10, an elevated pressure 1020 may be applied to the top surface of the pressure transmissive material 1010, and referring to FIG. 11, an elevated pressure 1120 may be applied to a portion 1116 of the conformal structure 1110. Either way, pressure is applied to the pressure transmissive material 1010, 1114, and the pressure transmissive material 1010, 1114 transmits the pressure to the top surface of the semiconductor die 120-122. According to another embodiment, an elevated pressure may be applied to interior surfaces of the conformal structure (e.g., to interior surfaces of conformal container 1112) without application of pressure from a source outside the conformal structure. For example, according to an embodiment, pressure transmissive material 1114 in a gaseous form may be released into or generated with a conformal container 1112 during an explosive reaction between two or more precursors (e.g., sodium azide and potassium nitrate, or other precursors).

According to an embodiment, the pressure 1020, 1120 instantaneously may be applied at a peak target pressure. Alternatively, the pressure 1020, 1120 may be increased from atmospheric pressure to the peak target pressure in a gradual manner as the temperature is increased (in block 316). According to an embodiment, the peak target pressure is in a range of about 3.0 megapascals (MPa) to about 30.0 MPa. In alternate embodiments, the peak target pressure may be lower or higher than the above given range.

The pressure 1020, 1120 may be applied to the pressure transmissive material 1010, 1114 in any of a number of different ways, according to various embodiments. For example, the pressure 1020, 1120 may be applied by applying mechanical pressure to the top surface 1012 of the pressure transmissive material 1010 (e.g., compressing the top surface 1012 with a piston) or to a surface 1116 of the conformal container 1112, applying hydraulic pressure to the top surface 1012 of the pressure transmissive material 1010 or to a surface 1116 of the conformal container 1112, or applying pneumatic pressure to the top surface 1012 of the pressure transmissive material 1010 or the surface 1116 of the conformal container 1112 (e.g., placing the assembly in a pressure chamber and increasing the pressure within the chamber, detonating a controlled explosion, or otherwise applying pneumatic pressure).

In block 316, while the pressure continues to be applied, the assembly is exposed to a temperature that is sufficient to cause the die attach material 740-742 to sinter. For example, the assembly may be positioned within an oven, and the temperature within the oven may be gradually or rapidly increased to achieve a sintering temperature. In addition or alternatively, the assembly may be exposed to microwave radiation sufficient to cause the die attach material 740-742 to sinter, where "exposure to a temperature" is considered to include "exposure to microwave radiation," as those terms are used herein. According to an embodiment, the assembly ultimately is exposed to a temperature in a range of about 200 degrees Celsius (C) to about 800 degrees C., although the sintering temperature could be lower or higher, as well. For example, in an embodiment in which the die attach material contains silver particles that sinter at a temperature between about 200 degrees C. and 300 degrees C., the assembly may be exposed to a temperature within that range (or to a higher temperature). In some embodiments, exposing the assembly to the elevated temperature may include heating the pressure transmissive material 1010, which conveys thermal energy to the assembly.

According to an embodiment, while the assembly is exposed to the increased temperatures and pressures, the assembly also may be exposed to an additional stimulus that may increase the heating of the die attach material to a temperature beyond that which is achieved merely by exposing the assembly to an elevated temperature. For example, the additional stimulus may include exposure of the assembly to ultrasonic energy or to some other stimulus. According to various specific embodiments, the assembly may be exposed to ultrasonic energy simultaneously with application of increased pressure and exposure to an increased temperature through exposure to microwave energy and/or elevated oven temperatures. The use of such additional stimulus may enable sintering to occur at temperatures and/or pressures that are lower than those that would be required if the additional stimulus were not applied.

As discussed above, conventional pressurized die attach methods include pressing against the top surface of a die using special equipment (e.g., specially machined or formed solids) in order to compress the die toward the substrate during the sintering process. The mechanical stresses imparted by the special equipment upon the die during the process may result in die cracking, which in turn leads to a decrease in manufacturing yields. In contrast, the above described embodiments of pressurized die attach methods apply a substantially uniform pressure across the surfaces of semiconductor die 120-122 during the sintering process, which decrease the likelihood of die cracking. In addition, the substantially uniform applied pressure may allow more uniform sintering to occur even when the semiconductor die 120-122 have die surface variations and/or different die thicknesses. Further, the above described embodiments do not require specially machined or formed solids for each configuration of dies and substrates. Accordingly, equipment and materials used to implement the above-described embodiments may be used generically for a wide variety of die and substrate configurations, thus reducing manufacturing equipment costs and, ultimately, device costs.

Referring again to FIG. 3 and also to FIG. 12, in block 318, once sintering of the metallic material in the die attach material 740-742 has occurred, the elevated pressure may be removed, the assembly may be permitted to cool, and the conformal structure (e.g., conformal solid 910 and pressure transmissive material 1010 or conformal structure 1110) are removed. This results in an assembly that includes the substrate 110, the semiconductor dies 120-122, and sintered metallic layers 140-142. The sintered metallic layers 140-142, in conjunction with mold lock structures 144, 146 (if included), rigidly bond the semiconductor dies 120-122 to the substrate 110.

Referring again to FIG. 3 and also to FIG. 1, the device may be completed in blocks 320 and 322. More specifically, in block 320, leads (e.g., leads 160, 162, FIG. 1) may be attached to the assembly (e.g., by attaching the leads to an insulating structure 170, FIG. 1), and the semiconductor die 120-122 may be electrically coupled to each other and to the device's leads using wirebonds (e.g., wirebonds 150-153, FIG. 1) or other types of electrical connections. In block 322, the device packaging may then be completed. For example, to produce device 100 of FIG. 1, a lid 180 may be attached to the device, thus forming an air cavity 190 within which the semiconductor die 120-122 are disposed. Alternatively, to produce an encapsulated device (e.g., device 200, FIG. 2), the semiconductor die 120-122 may be overmolded with an encapsulant material (e.g., encapsulant 270, FIG. 2).

An embodiment of a method of attaching a semiconductor die to a substrate includes placing a bottom surface of a semiconductor die over a top surface of a substrate with a die attach material between the bottom surface of the semiconductor die and the top surface of the substrate, resulting in an assembly that includes the substrate, the die attach material, and the semiconductor die. The method further includes contacting a top surface of the semiconductor die and the top surface of the substrate with a conformal structure that includes a non-solid, pressure transmissive material, and applying a pressure to the conformal structure. The pressure is transmitted by the non-solid, pressure transmissive material to the top surface of the semiconductor die. The method further includes, while applying the pressure, exposing the assembly to a temperature that is sufficient to cause the die attach material to sinter.

According to a further embodiment, the conformal structure includes a conformal solid and the non-solid, pressure transmissive material, and during the contacting step, the conformal solid directly contacts the top surfaces of the semiconductor die and the substrate, and the non-solid, pressure transmissive material is physically separated from the top surfaces of the semiconductor die and the substrate by the conformal solid. According to another further embodiment, contacting the top surface of the semiconductor die with the conformal structure includes applying the conformal solid over the top surface of the substrate and the top surface of the semiconductor die, and exposing the conformal solid to the non-solid, pressure transmissive material. According to another further embodiment, the conformal solid includes a container (e.g., a balloon or a bag) suitable for containing the non-solid, pressure transmissive material.

According to another further embodiment, the die attach material includes metallic particles (e.g., silver particles, gold particles, copper particles, nickel particles, and/or palladium particles) configured to produce a sintered metal when exposed to a temperature sufficient for sintering to occur. According to another further embodiment, the die attach material includes an additive material configured to increase a thermal conductivity of the die attach material during operation of a device that includes the assembly. According to another further embodiment, the method includes exposing the die attach material to a stimulus while exposing the assembly to the temperature, where the stimulus is selected from microwave radiation, and ultrasonic energy.

According to another further embodiment, before placing the bottom surface of the semiconductor die over the top surface of the substrate, the method further includes forming a plurality of first conductive mechanical lock features on the top surface of the substrate, and forming a plurality of second conductive mechanical lock features on the bottom surface of the semiconductor die.

Another embodiment of a method of attaching a semiconductor die to a substrate includes placing a bottom surface of a semiconductor die over a top surface of a substrate with a die attach material that contains silver particles between the bottom surface of the semiconductor die and the top surface of the substrate, resulting in an assembly that includes the substrate, the die attach material, and the semiconductor die. The method further includes contacting a top surface of the semiconductor die and the top surface of the substrate with a conformal structure. The conformal structure includes a conformal solid that directly contacts the top surfaces of the semiconductor die and the substrate, and a non-solid, pressure transmissive material that is physically separated from the top surfaces of the semiconductor die and the substrate by the conformal solid. The method further includes applying a pressure to the conformal structure, where the pressure is transmitted by the non-solid, pressure transmissive material to the top surface of the semiconductor die, and, while applying the pressure, exposing the assembly to a temperature that is sufficient to cause the silver particles to sinter.

An embodiment of a device includes a semiconductor die having a bottom surface, a substrate having a top surface, a plurality of first mechanical lock features formed on the top surface of the substrate, a plurality of second mechanical lock features formed on the bottom surface of the semiconductor die, and a sintered metallic layer interspersed with the first and second mechanical lock features between the bottom surface of the semiconductor die and the top surface of the substrate. According to a further embodiment, the sintered metallic layer comprises a metallic material selected from sintered silver, sintered gold, sintered copper, sintered nickel, and sintered palladium.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element in an electrical, mechanical, or other manner. Likewise, unless expressly stated otherwise, "coupled" means that one element is directly or indirectly joined to (or directly or indirectly communicates with) another element in an electrical, mechanical, or other manner. Thus, although the figures depict several exemplary arrangements of elements, additional intervening elements, devices, features, or components may be present in an embodiment of the depicted subject matter. Furthermore, terms such as "over," "under," "on," and the like are utilized to indicate relative position between two structural elements or layers and not necessarily to denote physical contact between structural elements or layers. Thus, a first structure or layer may be described as fabricated "over" or "on" a second structure, layer, or substrate without indicating that the first structure or layer necessarily contacts the second structure, layer, or substrate due to, for example, presence of one or more intervening layers.

The term "semiconductor die" is further used herein to broadly refer to an electronic device, component, or structure produced on a relatively small scale and amenable to packaging in the above-described manner. Semiconductor die include, but are not limited to, integrated circuits formed on semiconductor substrates, Microelectromechanical Systems ("MEMS") devices, active electronic components (e.g., transistors), passive electronic components (e.g., discrete resistors, capacitors, and inductors), optical devices, and other small scale electronic devices capable of providing processing, memory, sensing, radio frequency, optical, and transducer functionalities, to list but a few examples. Finally, terms such as "comprise," "include," "have," and the like are intended to cover non-exclusive inclusions, such that a process, method, article, or apparatus referred to as comprising, including, or having a list of elements is not necessarily limited to those elements, but may include other elements not expressly listed.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
a semiconductor die having a bottom surface;
a substrate having a top surface;
a plurality of first mechanical lock features formed on the top surface of the substrate;
a plurality of second mechanical lock features formed on the bottom surface of the semiconductor die; and
a sintered metallic layer interspersed with the first and second mechanical lock features between the bottom surface of the semiconductor die and the top surface of the substrate.

2. The device of claim 1, wherein the sintered metallic layer comprises a metallic material selected from sintered silver, sintered gold, sintered copper, sintered nickel, and sintered palladium.

3. The device of claim 1, wherein the sintered metallic layer is formed from a die attach material that includes metallic particles configured to produce a sintered metal when exposed to a temperature sufficient for sintering to occur.

4. The device of claim 3, wherein the metallic particles are selected from silver particles, gold particles, copper particles, nickel particles, and palladium particles.

5. The device of claim 3, wherein the metallic particles have sizes in a range of 10 nanometers to 100 nanometers.

6. The device of claim 1, wherein the first and second mechanical lock features are formed from a conductive material.

7. The device of claim 1, wherein the first and second mechanical lock features are formed using a technique selected from selective chemical etching, sputter etching, and selective plating.

8. The device of claim 1, wherein the sintered metallic layer includes an additive material configured to increase a thermal conductivity of the sintered metallic layer during operation of the device.

9. The device of claim 8, wherein the additive material is selected from graphene, diamond particles, silicon carbide, titanium carbide, and boron nitride.

10. The device of claim 1, wherein the substrate forms a portion of a structure that includes multiple interconnected substrates.

11. A device comprising:
   a semiconductor die having a bottom surface with a conductive contact;
   a substrate having a conductive top surface;
   a plurality of first conductive mechanical lock features formed on the top surface of the substrate;
   a plurality of second conductive mechanical lock features formed on the bottom surface of the semiconductor die; and
   a sintered metallic layer interspersed with the first and second conductive mechanical lock features between the bottom surface of the semiconductor die and the top surface of the substrate.

12. The device of claim 11, wherein the sintered metallic layer comprises a metallic material selected from sintered silver, sintered gold, sintered copper, sintered nickel, and sintered palladium.

13. The device of claim 11, wherein the sintered metallic layer includes an additive material configured to increase a thermal conductivity of the sintered metallic layer during operation of the device.

14. The device of claim 13, wherein the additive material is selected from graphene, diamond particles, silicon carbide, titanium carbide, and boron nitride.

15. The device of claim 11, wherein the substrate is formed from a homogenous conductive material.

16. The device of claim 11, wherein the substrate is formed from a bulk material with a conductive layer at the top surface of the substrate.

17. The device of claim 11, wherein the semiconductor die is a field effect transistor, and the conductive contact is a conductive drain contact on the bottom surface of the semiconductor die.

18. The device of claim 11, further comprising:
   a plurality of leads;
   an insulating structure that electrically insulates the plurality of leads from the top surface of the substrate; and
   a plurality of wirebonds electrically coupled between the plurality of leads and the semiconductor die.

19. The device of claim 11, further comprising:
   a plurality of leads;
   a plurality of wirebonds electrically coupled between the plurality of leads and the semiconductor die; and
   encapsulation covering the die, the wirebonds, the top surface of the substrate, and portions of the plurality of leads.

* * * * *